(12) United States Patent
Oshins et al.

(10) Patent No.: US 6,980,944 B1
(45) Date of Patent: Dec. 27, 2005

(54) SYSTEM AND METHOD FOR SIMULATING HARDWARE COMPONENTS IN A CONFIGURATION AND POWER MANAGEMENT SYSTEM

(75) Inventors: Jacob Oshins, Seattle, WA (US); Stephane G. Plante, Kirkland, WA (US); Vincent J. Geglia II, Duvall, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 09/527,788

(22) Filed: Mar. 17, 2000

(51) Int. Cl.$^7$ .................. G06F 17/50; G06F 13/10
(52) U.S. Cl. ............................. 703/17; 703/21
(58) Field of Search .............. 703/17, 15, 21; 709/321, 324, 327, 223

(56) References Cited

U.S. PATENT DOCUMENTS

| | | | | |
|---|---|---|---|---|
| 5,457,798 A | * | 10/1995 | Alfredsson | 719/321 |
| 5,542,069 A | * | 7/1996 | Meppelink et al. | 703/17 |
| 5,963,725 A | * | 10/1999 | Inoue | 703/17 |
| 6,055,643 A | * | 4/2000 | Chaiken | 713/323 |
| 6,182,242 B1 | * | 1/2001 | Brogan et al. | 714/26 |
| 6,185,677 B1 | * | 2/2001 | Nijhawan | 713/2 |
| 6,233,624 B1 | * | 5/2001 | Hyder et al. | 709/327 |

OTHER PUBLICATIONS

"Using VtoolsD™, Power Tools for VxD Development in C and C++", Compuware Corporation, Apr. 1999, pp. 1-236.*
Karen Hazzah, "Writing Windows VxDs and Device Drivers", R&D Books, 1997, pp. v-xiv, 9-17, 19-36 & 127-169.*
Walter Oney, "Systems Programming for Windows 95" Microsoft Press, 1996, pp. v-vii, 21-37.*

* cited by examiner

*Primary Examiner*—Paul L. Rodriguez
*Assistant Examiner*—Dwin M. Craig
(74) *Attorney, Agent, or Firm*—Law Offices of Albert S. Michalik, PLLC

(57) ABSTRACT

A mechanism for simulating the existence of hardware in a configuration and power management system is described. In one aspect, a simulator interfaces with the configuration and power management system to generate simulated events. In another aspect, accesses to hardware registers are simulated by registering the simulator with the configuration and power management system to handle accesses to a simulated hardware device. A component within the configuration and power management system may define the simulated hardware device such that accesses to the simulated hardware device occur with respect to a defined I/O space.

48 Claims, 7 Drawing Sheets

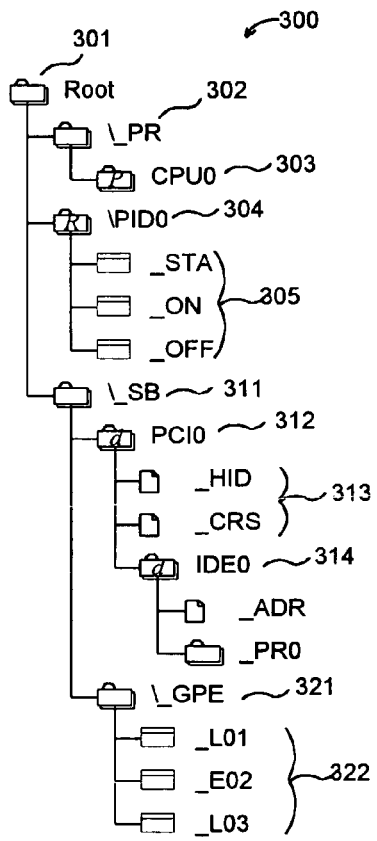

- Processor Tree
- Processor 0 object
- Power resource for IDE0
- Method to return status of power resourse
- Method to turn on power resourse
- Method to turn off power resourse
- System bus tree
- PCI bus
- Device ID
- Current resources (PCI bus number)
- IDE0 device
- PCI device #, function #
- Power resource requirements for D0
- General purpose events (GP_STS)
- Method to handle level GP_STS.1
- Method to handle edge GP_STS.2
- Method to handle level GP_STS.3

| Key | |
|---|---|
| 🗁 | Package |
| | Processor Object |
| | Power Resource Object |
| | Bus/Device Object |
| ▢ | Data Object |
| ▭ | Control Method (AML code) |

FIG. 3

SYSTEM AND METHOD FOR SIMULATING HARDWARE COMPONENTS IN A CONFIGURATION AND POWER MANAGEMENT SYSTEM

FIELD OF THE INVENTION

The present invention relates to computer systems, and more particularly, to the development and testing of a configuration management subsystem of a computer system.

BACKGROUND OF THE INVENTION

ACPI (Advanced Configuration and Power Interface) is an open industry specification that defines a flexible and extensible interface for power management. The interface enables and supports power management through improved hardware and operating system coordination. ACPI allows the operating system to control the power states of many ACPI-compliant hardware components, and/or to pass information to and from some hardware components, such as the temperature of a thermal sensor or the power remaining in a battery.

Because components of the ACPI system reside in both hardware and software, the efficient development and testing of an ACPI system is difficult. For instance, debugging an ACPI-compliant computer system requires fully-functional hardware components compatible with the ACPI system before the ACPI-compliant software can be thoroughly tested. However, developing hardware or firmware with appropriate and debugged ACPI code to adequately test an ACPI system is a time-consuming and expensive process. Therefore, reliably testing the ACPI system software is difficult until the ACPI hardware is appropriately debugged, which, in turn, requires reliable ACPI software to achieve. This circular dependency makes effective testing and debugging of the ACPI system very difficult, which slows the development of the ACPI system software. Moreover, because the development of the ACPI system software ordinarily follows the development of ACPI hardware, it is difficult to timely incorporate effective support in the ACPI system software for newer ACPI features made available in the ACPI-compliant hardware. Thus, an effective mechanism for adequately testing ACPI software has eluded those skilled in the art.

SUMMARY OF THE INVENTION

The present invention provides a mechanism for simulating the actions and/or existence of hardware in a configuration and power management system. Events typically generated by hardware devices are simulated to test the configuration and power management system's handling of those events. In addition, access to hardware registers, such as to read or write data, may be simulated by the mechanism.

In one aspect, briefly described, the present invention makes use of a simulator that interfaces with the configuration and power management system to generate simulated events (e.g., the triggering of a hardware interrupt) by executing simulator control methods within the configuration and power management system that resemble hardware interrupt handler methods. The simulator control methods are provided by the simulator and are loaded into the configuration and power management system for access by the simulator. The simulator control methods may be loaded into a store of control methods used by various components of the configuration and power management system. To simulate the generation of an event by a hardware device, the simulator executes a simulator control method, which issues the same message to the configuration and power management system that would have been issued by a hardware interrupt handler control method. In this way, the present invention allows arbitrary events to be generated without reliance upon hardware to generate those events, thereby allowing the testing of the configuration and power management system in the absence of the actual hardware generation of those events.

In another aspect, briefly described, the present invention simulates access to hardware registers (such as to read or write data) by registering the simulator with the configuration and power management system to handle those accesses. A component within the configuration and power management system may define the simulated hardware device such that accesses to the simulated hardware device occur with respect to a defined I/O space. The simulator registers itself with the configuration and power management system to handle accesses to the defined I/O space, and accordingly accesses within the configuration and power management system to the simulated hardware device are passed to the simulator. In that way, when components of the configuration and power management system attempt to access registers within the simulated hardware device, those attempts are redirected to the simulator which may respond in any arbitrary way, e.g. randomly or as determined by a tester. As a result, the configuration and power management system may be tested, for example, by providing arbitrary values for data when queried by the configuration and power management system, or by responding in unpredictable ways when an attempt is made to write data to the simulated hardware device.

Other advantages will become apparent from the following detailed description when taken in conjunction with the drawings, in which:

BRIEF DESCRIPTION OF THE DRAWINGS

FIG. 3 is a graphical representation of a namespace employed by the illustrative configuration management system illustrated in FIG. 2 and embodying one implementation of the present invention;

DETAILED DESCRIPTION

Exemplary Operating Environment

Figure 1:
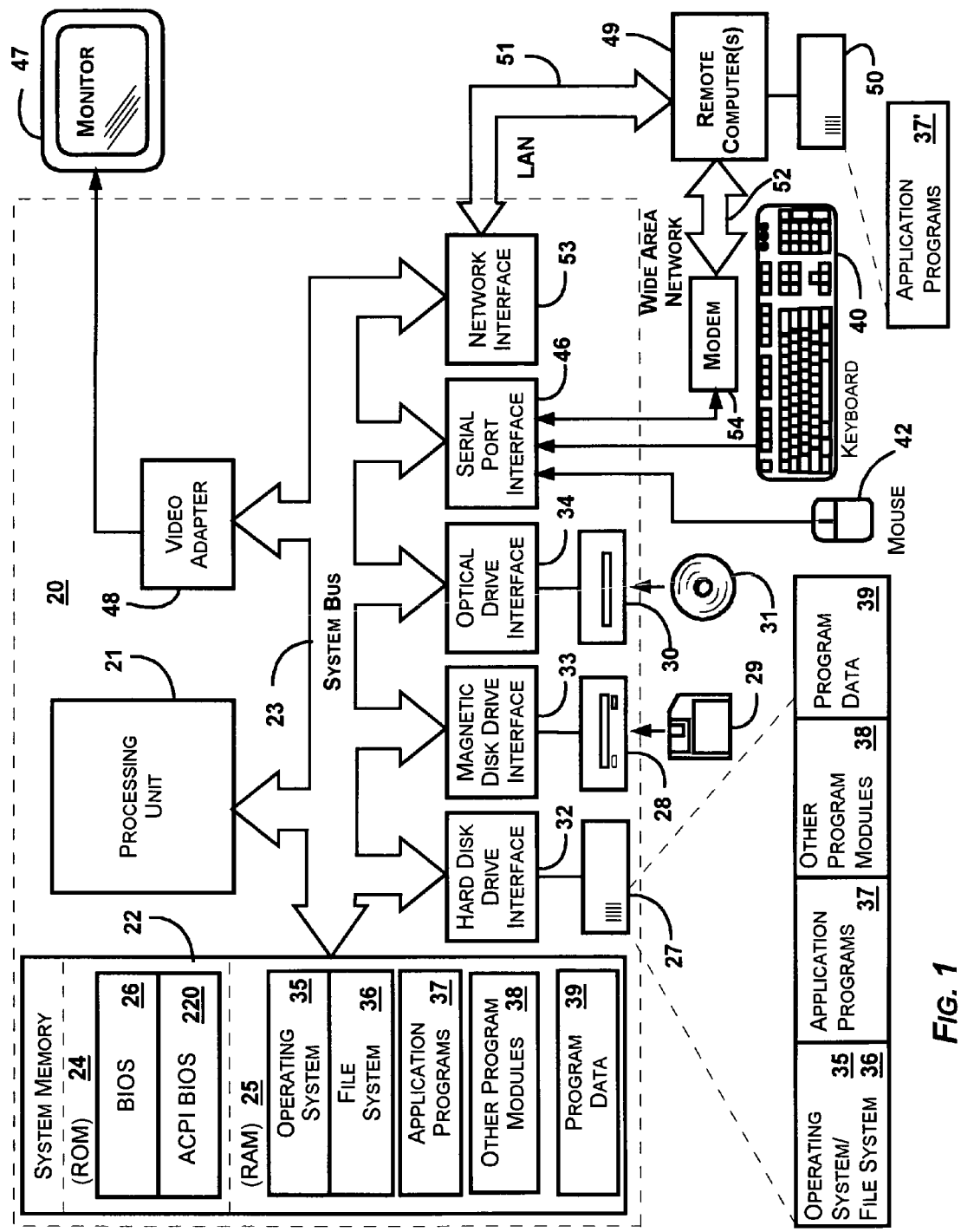
FIG. 1 is a functional block diagram representing a computer system into which the present invention may be incorporated.

FIG. 1 and the following discussion are intended to provide a brief general description of a suitable computing environment in which the invention may be implemented. Although not required, the invention will be described in the general context of computer-executable instructions, such as program modules, being executed by a computer system. Generally, program modules include routines, programs, objects, components, data structures and the like that perform particular tasks or implement particular abstract data types.

Moreover, those skilled in the art will appreciate that the invention may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the invention includes a general purpose computing device in the form of a conventional computer system 20 or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25. A basic input/output system 26 (BIOS), containing the basic routines that help to transfer information between elements within the computer system 20, such as during start-up, is stored in ROM 24. An ACPI BIOS 220 is additionally stored in ROM 24, and may be stored as a portion of the BIOS 26. The ACPI BIOS 220 is described in detail below.

The computer system 20 may further include a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD-ROM, DVD-ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide non-volatile storage of computer readable instructions, data structures, program modules and other data for the computer system 20. Although the exemplary environment described herein employs a hard disk, a removable magnetic disk 29 and a removable optical disk 31, it should be appreciated by those skilled in the art that other types of computer readable media that can store data that is accessible by a computer, such as magnetic cassettes, flash memory cards, digital video disks, Bernoulli cartridges, random access memories (RAMs), read-only memories (ROMs) and the like may also be used in the exemplary operating environment.

A number of program modules may be stored on the hard disk, magnetic disk 29, optical disk 31, ROM 24 or RAM 25, including an operating system 35 (preferably Windows® 2000). The computer 20 includes a file system 36 associated with or included within the operating system 35, such as the Windows NT® File System (NTFS), one or more application programs 37, other program modules 38 and program data 39. A user may enter commands and information into the computer system 20 through input devices such as a keyboard 40 and pointing device 42. Other input devices (not shown) may include a microphone, joystick, game pad, satellite dish, scanner or the like. These and other input devices are often connected to the processing unit 21 through a serial port interface 46 that is coupled to the system bus, but may be connected by other interfaces, such as a parallel port, game port or universal serial bus (USB). A monitor 47 or other type of display device is also connected to the system bus 23 via an interface, such as a video adapter 48. In addition to the monitor 47, computer systems typically include other peripheral output devices (not shown), such as speakers and printers.

The computer system 20 may operate in a networked environment using logical connections to one or more remote computers 49. The remote computer (or computers) 49 may be another computer system, a server, a router, a network PC, a peer device or other common network node, and typically includes many or all of the elements described above relative to the computer system 20, although only a memory storage device 50 has been illustrated in FIG. 1. The logical connections depicted in FIG. 1 include a local area network (LAN) 51 and a wide area network (WAN) 52. Such networking environments are commonplace in offices, enterprise-wide computer networks, Intranets and the Internet.

When used in a LAN networking environment, the computer system 20 is connected to the local network 51 through a network interface or adapter 53. When used in a WAN networking environment, the computer system 20 typically includes a modem 54 or other means for establishing communications over the wide area network 52, such as the Internet. The modem 54, which may be internal or external, is connected to the system bus 23 via the serial port interface 46. In a networked environment, program modules depicted relative to the computer system 20, or portions thereof, may be stored in the remote memory storage device. It will be appreciated that the network connections shown are exemplary and other means of establishing a communications link between the computers may be used.

Illustrative Configuration Management System

Figure 2:
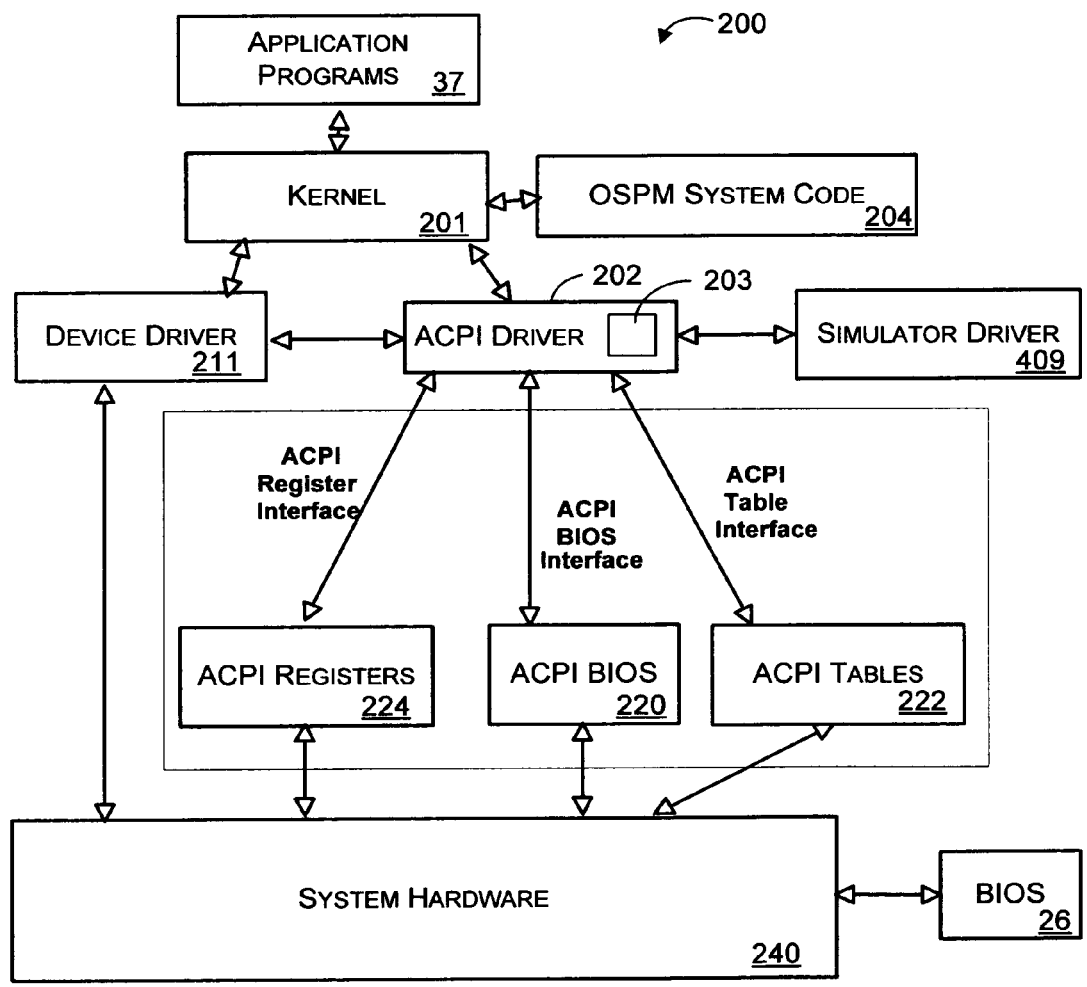
FIG. 2 is a functional block diagram of an illustrative configuration management system constructed in accordance with one implementation of the present invention.

FIG. 2 is a functional block diagram of an ACPI system 200 as implemented in the computer system 20 of FIG. 1. The ACPI system 200 illustrated is one example of a configuration management system that may benefit from the present invention. The present invention may be described herein with reference to the ACPI configuration management system, however, there is no intention to limit the present invention to ACPI. Rather, the present invention is intended to operate with and provide benefits with any operating system, architecture, and/or configuration management system.

As shown, the application programs 37 may interface with a kernel 201, which is a part of the operating system 35. The kernel 201 can be generally considered as one or more software modules that are responsible for performing many operating system functions. One such function is passing information between the application programs 37 and the lower level components of the ACPI system 200, such as the ACPI driver 202 (described below) and various device drivers (e.g., device driver 211).

The kernel 37 interfaces with Operating System Power Management (OSPM) system code 204. The OSPM system code 204 comprises one or more software modules that may be a part of the operating system 35 and that may be used to modify the behavior of certain components of the computer system 20, typically to conserve power in accordance with pre-configured power conservation settings. One device driver, a simulator driver 409, implements one aspect of the invention and is described in greater detail below with respect to FIG. 4. As is generally known, the various device drivers 211 interface with and generally control the hardware installed in the computer system 20.

The ACPI driver 202 is, generally speaking, a module that controls the functioning of much of the ACPI system 200. The ACPI driver 202 may be supplied as part of the operating system 35 or as a separate component. In the described system, the ACPI driver 202 is loaded during system start-up at the base of a tree of devices, where it acts as an interface between the operating system 35 and the BIOS 26. The responsibilities of the ACPI driver 202 include support for plug and play (PnP) and power management. The ACPI driver 202 is responsible for initiating and maintaining the ACPI system 200, such as by populating an ACPI namespace (illustrated in FIG. 3 and described below) at system startup, loading and unloading description blocks from the ACPI namespace at run time, handling certain generic events triggered by ACPI hardware, and handing off other events to modules registered to handle those events.

The ACPI driver 202 makes use of several components when performing the functions of the ACPI system 200. One component is the ACPI BIOS 220, which refers to the portion of system firmware that is compatible with the ACPI specification. Generally stated, the ACPI BIOS 220 is part of the code that boots the machine (similar to the BIOS present in most conventional computer systems) and implements interfaces for power and configuration operations, such as sleep, wake, and some restart operations. The ACPI BIOS 220 contains definition blocks used to construct ACPI Tables 222, as is described in greater detail below. Note that although the BIOS 26 and the ACPI BIOS 220 are illustrated as separate components in FIG. 2, they may be implemented as one component in the computer system 20.

The ACPI Tables 222 are composed of as few as one, but most likely many, definition blocks that contain data and/or control methods. Each set of data and/or control methods defines and provides access to a respective hardware device. The definition blocks are written in an interpreted language called ACPI Machine Language (AML), the interpretation of which is performed by an AML interpreter 203 within the ACPI driver 202. One such definition block, a Differentiated Definition Block (DDB), describes the base computer system. Other definition blocks may be provided to describe additional ACPI devices.

As mentioned, the definition blocks may contain control methods. A "control method" is a software module that defines how the ACPI system 200 performs a hardware-related task. For example, the ACPI system 200 may invoke a control method to read the temperature of a thermal zone. Control methods are written in AML, are stored in the definition blocks within the ACPI BIOS 220, and are loaded into the ACPI namespace 300 (FIG. 3), typically at system boot up. Once in the ACPI namespace 300, the control methods may be invoked by other components in the ACPI system 200, such as device drivers or the like, and are then interpreted and executed by a virtual machine in the ACPI driver 202. The use and structure of the ACPI namespace, and the objects within, are described in greater detail below with respect to FIG. 3.

The ACPI registers 224 are a constrained part of the hardware interface, described (at least in location) by the ACPI Tables 222. For a more detailed discussion of the ACPI tables 222, definition blocks, and the functions performed by the ACPI driver, refer to Sections 5 and 16 of the publicly-available ACPI Specification Version 1.0, which is hereby incorporated by reference in its entirety.

FIG. 3 is a graphical representation of one possible ACPI namespace 300 which is created hierarchically and essentially represents a working version of the ACPI tables 222. The ACPI Namespace 300 is a hierarchical tree structure in protected memory that contains named objects which describe the ACPI-aware devices installed in the computer system 20. The objects may be data objects, control method objects, bus/device package objects, or the like. The information in the ACPI namespace 300 comes from the Differentiated System Description Table (DSDT) stored in the ACPI BIOS 220. The DSDT contains the Differentiated Definition Block (DDB), and may contain one or more other definition blocks. As mentioned, at boot time, the operating system 35 (via the ACPI driver 202) reads the ACPI tables 222 from the ACPI BIOS 220 and loads certain definition blocks (e.g., the DDB) from the ACPI tables 222 to construct the ACPI namespace 300. The ACPI driver 202 may dynamically change the contents of the ACPI namespace 300 at run time by loading and/or unloading additional definition blocks from the ACPI Tables 222.

Shown in FIG. 3 is one illustrative ACPI namespace 300, containing a namespace root 301, several illustrative branches under the root, and several other objects of various types. For example, under the root is a processor tree namespace \_PR 302. Processor objects, such as the Processor 0 object CPU0 303, are defined under the processor tree \_PR namespace 302. For more information about processor objects, see Section 8 of the ACPI Specification.

Power resource objects, such as power resource object \_PID0 304, may also reside under the namespace root 301. For example, the object \PID0 304 may define a power resource for a particular device, such as an on-off switch for an IDE device. The \_SB namespace 311 includes namespace objects that define ACPI-compliant components attached to the system bus. One example of such a namespace object is the PCI bus namespace object 312. Each namespace object may contain other objects, such as data objects 313, control methods, or other namespace object (e.g., IDE namespace object 314).

Several control methods may be loaded in the ACPI namespace 300 in connection with various objects. For example, control methods related to the status and maintenance of a particular power resource object may be loaded within the scope of the power resource object, such as control methods 305 under the power resource object \PID0 304. The \_GPE namespace 311 includes additional control methods (e.g., control methods 322) to handle particular general purpose events triggered by ACPI-aware components in the ACPI system 200.

For each device described in the ACPI namespace 300, the ACPI driver 202 creates either a filter Device Object (filter DO) or a Physical Device Object (PDO). If the device is capable of being enumerated by an element of another subsystem, such as a Plug-n-Play subsystem, that element of the other subsystem creates a PDO for the device and the ACPI driver 202 puts a filter DO on top of the PDO. If the ACPI namespace is the only possible enumeration mechanism, the ACPI driver 202 creates the PDO. ACPI provides power management features to the device stack by means of these device objects. For more information on the meaning of filter DOs, PDOs and Functional DOs (FDOs), refer to the Microsoft Windows® 2000 Driver Development Kit, available from the Microsoft Corporation of Redmond, Wash., and incorporated herein.

Hardware Simulator

The ACPI system 200 accesses hardware devices via AML statements that cause I/O operations to the hardware, which are either read (load) or write (store) statements, but not both in the same statement. Load or store operations are performed with respect to an "Operation Region." Operation regions are a type of data object associated with a namespace object that contain hardware registers for use by control methods. Via an operation region, read or write operations are performed from or to the hardware described by the namespace object. For example, a definition block for a particular device may define a namespace object having an operation region within a bus or system I/O space. A read or write to the namespace object is interpreted by the ACPI driver 202 as an access of the defined bus or system I/O space. To read from or write to hardware represented by the namespace object, the ACPI driver 202 issues a read or a write command with a pointer to an operation region and an appropriate offset into the pointed-to operation region.

The ACPI Specification defines five operation region types: type 0 (System Memory), type 1 (System I/O), type 2 (PCI_Config), type 3 (Embedded Controller), and type 4 (SMBus). The ACPI driver 202 is configured to handle I/O accesses to those predefined operation regions. However, the ACPI Specification provides for operation regions other than those defined above. In particular, operation regions having a type number between 0x80 and 0xFF are available for use by ACPI-compliant hardware. To take advantage of a user-defined operation region, a component in the ACPI system 200, such as a device driver, registers itself to handle reads or writes to the user-defined operation region.

Figure 4:
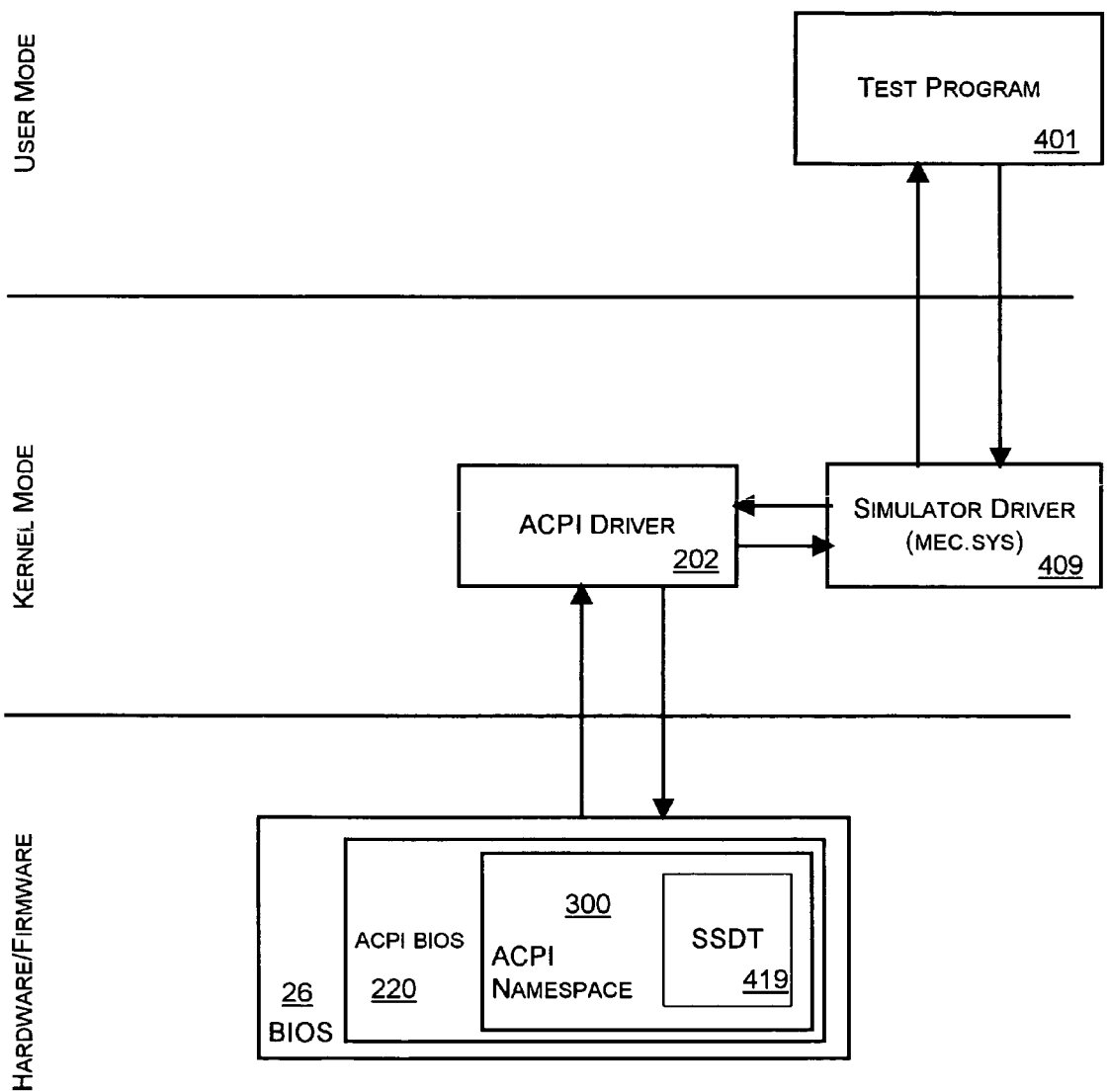
FIG. 4 is a functional block diagram of certain components of the illustrative configuration management system illustrated in FIG. 2 and configured in accordance with one implementation of the present invention.

FIG. 4 is a functional block diagram of particular components within the ACPI system 200 as configured to provide the benefits of the present invention. In existing computer systems with ACPI-compliant hardware and firmware, ACPI events generally originate within the hardware itself. Typically, the hardware causes a System Control Interrupt (SCI) to be triggered, which causes the ACPI driver 202 to execute one of the control methods 322 in the \_GPE namespace 321 associated with the particular interrupt. In accordance with one aspect of the present invention, events may be arbitrarily generated by a test program, such as test program 401, without being initiated in hardware. For example, such test events can simulate hardware events that are otherwise difficult to reproduce, thereby facilitating the prototyping of new ACPI hardware and the debugging of the ACPI system 200. To that end, the system firmware includes simulator description tables 419. A simulator driver 409 is also provided, as is a user interface (the test program 401).

In accordance with one implementation of the invention, the simulator description tables 419 include definition blocks that define a simulator namespace object. The simulator namespace object includes control methods that may be invoked to simulate a hardware interrupt, and a data object that defines an operation region of a new type. When the simulator description tables 419 are loaded (either at boot time or later), the simulator namespace object is created in the ACPI namespace 300 and includes the data object defining the new operation region, and the control methods.

The test program 401 is an application program 37 configured to provide a instructions or commands to the ACPI system 200 to test the operation of the system. As shown, the test interfaces with the simulator driver 409. The simulator driver 409 is configured to respond to instructions from the test program 401 by causing particular control methods to be executed within the scope of the simulator namespace object (as defined in the simulator description tables 419). The simulator driver 409 may alternatively or additionally be configured to cause the particular control methods to be executed in response to some other triggering event, such as the expiration of a timer, a hardware interrupt from a hardware device, or the like. In addition, the simulator driver 409 is configured to register with the ACPI system 200 as a provider for the new operation region type (defined in the simulator definition tables 419), and, in a test situation, is capable of passing requests for data (reads to the new operation region) to the test program 401.

With this construct, ACPI events (such as system control interrupts) may be simulated or generated by causing the simulator driver 409 to execute one of the control methods loaded in the ACPI namespace 300. For instance, to simulate an interrupt by a thermal sensor indicating a change in temperature, a particular control method (such as a control method that, when called, invokes the General Purpose Event (GPE) handler for the interrupt) may be loaded under the simulator namespace object. By executing the control method (via the simulator driver 409), the ACPI system 200 is essentially "tricked" into behaving as if the hardware interrupt were generated.

In addition, data accesses to hardware devices may be simulated through the use of the new operation region. To that end, when a command is issued that invokes a read or write to the new operation region (e.g., a read of a hardware data register containing a temperature for a thermal sensor), the ACPI driver 202 passes that command to the provider that has registered itself to handle that operation region, in this example the simulator driver 409. When it receives the command, the simulator driver 409 may essentially take any arbitrary action in response.

To illustrate the operation of the invention, consider the following example. The simulator definition block 419 may define a simulated "Thermal Zone" that accesses its data through an operation region type number 0x84. The operation region 0x84 may be created by a data object also defined within the definition block 419. When the simulator definition block 419 is loaded into the ACPI namespace 300, a namespace object is created that allows reads and writes to operation region 0x84. When the simulator driver is loaded, it registers itself with the ACPI system 200 as a provider for operation region 0x84.

Once the ACPI namespace 300 is populated and the simulator driver has registered itself, the test program 401 may generate an asynchronous event within the ACPI system 200 by issuing a command to the simulator driver 409 to execute a control method in the ACPI namespace 300 associated with the simulated Thermal Zone. For instance, to signal to the ACPI system 200 that the simulated temperature has changed, the simulator driver 409, as instructed by a command from the test program 401, may run a certain control method (e.g., under the \_SB namespace), which, when interpreted, issues a notification that the simulated temperature of the simulated Thermal Zone has changed. Note that the notification is issued without reliance on the event having been generated by actual hardware. In this way, the simulator driver 409 is able to simulate an interrupt generated by a hardware device.

In response to the notification, the ACPI system 200 may query for the new temperature from the simulated Thermal Zone in the same manner as it would from a real thermal zone. The ACPI driver 202 may read the value of the temperature from the defined operation region to provide access to the temperature register of the simulated Thermal Zone. Because the simulator driver 409 is registered to handle the particular operation region, the ACPI driver 202 passes the request to the simulator driver 409. The simulator driver 409 may then execute any arbitrary function, and/or return any arbitrary value for the simulated temperature, including one specified at the test program 401. It should be noted that to the ACPI driver 409, there is no difference between a real thermal zone or the simulated thermal zone, nor is there any difference between accessing the temperature from real hardware or from simulated hardware.

It can, therefore, be appreciated that this implementation of the invention provides a mechanism by which the test program 401, the simulator driver 409, and the simulator definition tables 419 may be used to simulate the existence of ACPI-compatible hardware in the ACPI system 200. Although the described example illustrates only the situation where an attempt to read data from simulated software is returned arbitrary data, it should be appreciated that any I/O operation to the simulated hardware may be handled, such as writing data to a simulated hardware register or issuing commands to a simulated hardware device.

Sample Code

Figure 5:
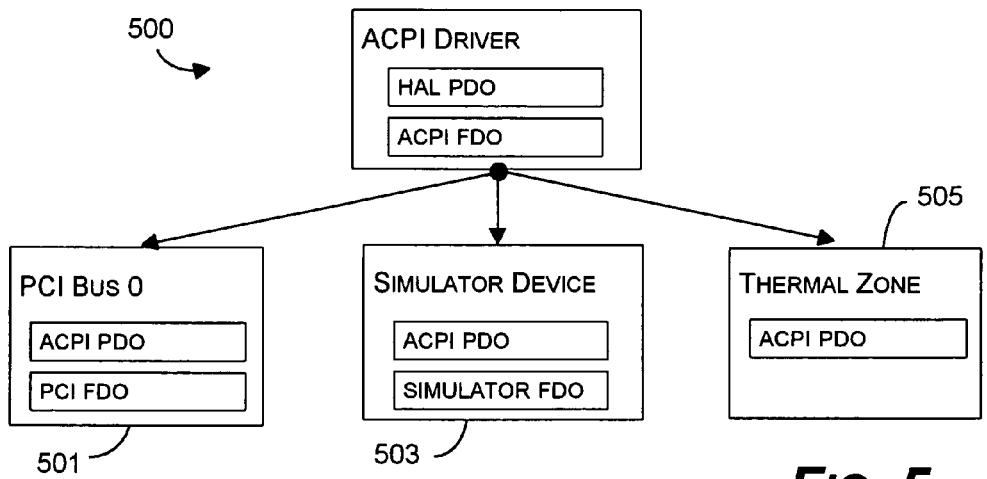
FIG. 5 is a functional block diagram illustrating a sample device tree resulting from sample code that may be employed in an exemplary implementation of the invention.
Figure 6:
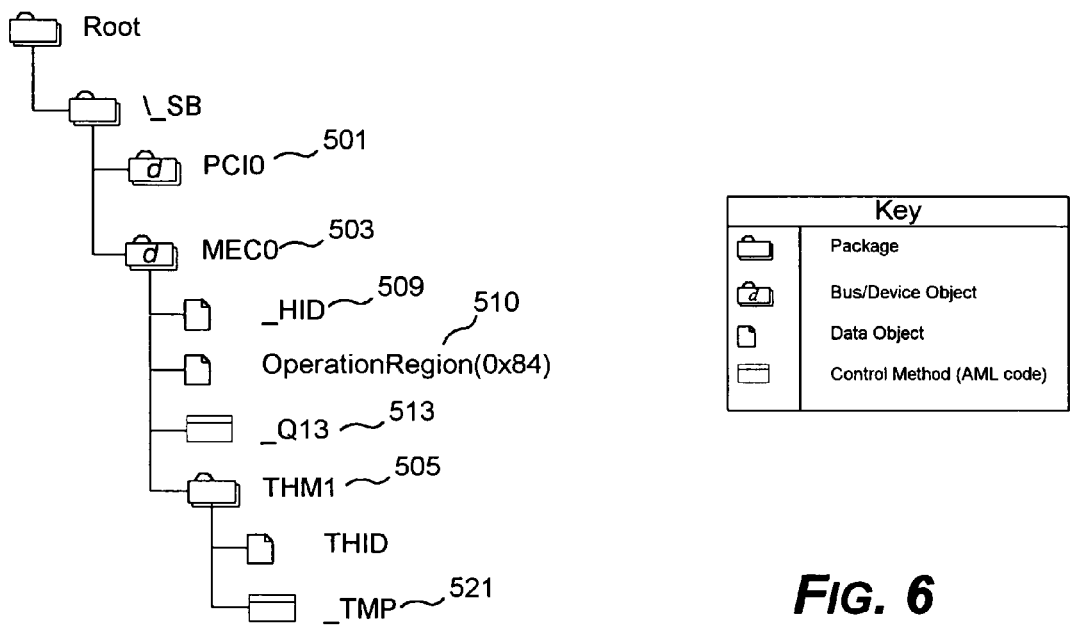
FIG. 6 is a graphical representation of a namespace resulting from sample code that may be employed in the exemplary implementation of the invention.

To further illustrate the described implementation of the invention, sample ACPI Source language (ASL) code follows that defines the device tree illustrated in FIG. 5 and the abbreviated ACPI namespace illustrated in FIG. 6.

```
Scope(\_SB) {
   Device(PCI0) {
      Name(_HID, EISAID("PNP0A03"))
      Name(_UID,0)
      Name(_ADR, 0x00000000)
      Method(_BBN,0) {
         Return(0x0)
      }
      Method(_STA, 0) {
         Return(0x0F)
      }
      Method(_CRS) {
         ( . . . )
      }
   }
   Device(MEC0) {
      Name(_HID, EISAID("PNP0C11"))
      OperationRegion(MEC, 0x84, 0, 0x16)
      Field(MEC, DwordAcc, Lock, Preserve) {
         TIDX, 32,
         TDAT, 32,
         BIDX, 32,
         BDAT, 32
      }
      Name(_CRS,
      ResourceTemplate( ) {
         ( . . . )
      )
      Method(_STA, 0) {
      Return(0xF)
   }
   Method(_QFF, 1) {
      ShiftLeft(1, Subtract(Arg0, 1), Local0)
      Or(Local0, THNT, THNT)
   }
   Method(_QFE, 1) {
      Notify
      If(And(Local0, THNT)) {
```

-continued

```
         Subtract(THNT, Local0, THNT)
      }
      Method(_Q13, 0) {
         Notify(\_SB.THM1, 0x80)
      }
   }
}
ThermalZone (THM1) {
   Name(THID, 1)
   Method(_TMP) {
      If(LEqual(RDYT(THID), 0x0)) {
         Return (300)
      }
      Store(Add(Multiply(THID, 0x14), 0x0), \_SB.MEC0.TIDX)
      Return (\_SB.MEC0.TDAT)
   }
   Method(_AC0) {
      If(LEqual(RDYT(THID), 0x0)) {
         Return (325)
      }
      Store(Add(Multiply(THID, 0x14), 0x2), \_SB.MEC0.TIDX)
      Return (\_SB.MEC0.TDAT)
   }
   Name(_AL0, Package( ) {FAN0, FAN1})
   Method(_AC1) {
      If(LEqual(RDYT(THID), 0x0)) {
         Return (315)
      }
      Store(Add(Multiply(THID, 0x14), 0x3), \_SB.MEC0.TIDX)
      Return (\_SB.MEC0.TDAT)
   }
   Name(_AL1, Package( ) {FAN1})
   Method(_CRT) {
      If(LEqual(RDYT(THID), 0x0)) {
         Return (350)
      }
      Store(Add(Multiply(THID, 0x14), 0x1), \_SB.MEC0.TIDX)
      Return (\_SB.PCI0.MEC0.TDAT)
   }
   Method(_SCP, 1) { }
   Name(_TC1, 1)
   Name(_TC2, 2)
   Method(_TSP, 0) {
      If(LEqual(RDYT(THID), 0x0)) {
         Return (150)
      }
      Store(Add(Multiply(THID, 0x14), 0xF), \_SB.MEC0.TIDX)
      Return (\_SB.MEC0.TDAT)
   }
 }
}
```

Referring to both FIG. 5 and FIG. 6, the sample code illustrated above defines a device tree 500 including a PCI bus namespace object 501, a simulator namespace object 503, and a thermal zone object 505. Those skilled in the art will appreciate that many objects defined by the code above are omitted from the abbreviated ACPI namespace illustrated in FIG. 6 for simplicity of discussion only. The "Device(MEC0)" statement shown above creates the simulator namespace object 503, and the "ThermalZone (THM1)" statement above creates the thermal zone object 505.

The simulator namespace object 503 defines the thermal zone object 505. Typically, thermal zone objects allow the operating system 35 to monitor the current temperature of a region of the computer system 20. However, the thermal zone object 503 of this implementation is associated with a simulated thermal zone and does not correspond to actual ACPI-compliant hardware. In addition, the simulator namespace object 503 contains several data objects (e.g., the name data object "_HID" 509 and the OperationRegion data object 510) and control methods (e.g., the control method "_Q13" 513).

The sample code allows asynchronous events to originate within the simulator driver 409. The \_Q13 control method 513, when executed, issues a notification (i.e., the "Notify (\\_SB.THM1, 0x80)" statement) to the ACPI driver 202 that the temperature of the thermal zone represented by the thermal zone object 505 has changed. Executing the \_Q13 control method 513 is performed by the simulator driver 409. In this way, the simulator driver 409 is able to simulate the issuance of a notice from a hardware thermal sensor that the temperature changed by simply executing the \_Q13 control method 513.

In addition, several control methods (e.g., the \_TMP method 521) are created under the thermal zone object 505. The \_TMP control method 521 causes the ACPI driver 202 to query for the current temperature of the thermal zone from the simulator namespace object 503. This is accomplished by issuing a read request to the I/O space identified by the operation region statement "OperationRegion(MEC, 0x84, 0, 0x16)" in the sample code (i.e., the operation region object 510). Because the operation region is defined as type number 0x84, the ACPI driver 202 passes the read request to the component of the ACPI system 200 that has registered as a provider for that operation region, the simulator driver 409 in this example. As can be appreciated, a separate component may be employed as the registered simulator provider.

The contents of specific addresses or fields within the operation region space are defined within the simulator driver 409. Since the simulator driver 409 can take virtually any action that it chooses in response to the read request, data returned to the ACPI driver 202 can be synthesized to test the ACPI system 200, such as by returning an extremely high or low value. In the sample code, the fields "TIDX" and "TDAT" implement an index/data register pair that may be used to return simulated temperature data. For example, an extremely high value can be returned to evaluate how the system reacts.

Operation of the Configuration Management System

Figure 7:
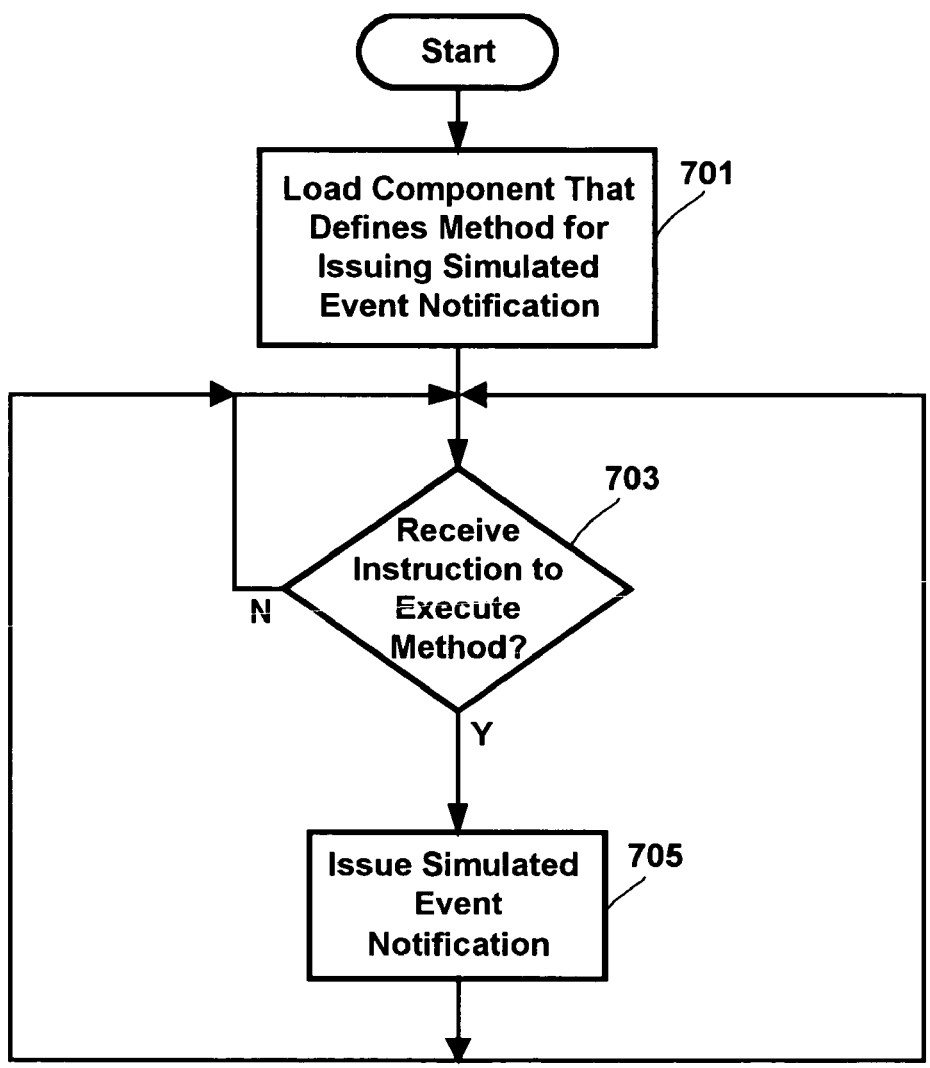
FIG. 7 is a logical flow diagram generally representing a process performed by one component of a configuration management system configured in accordance with the invention to simulate a hardware-generated event.
Figure 8:
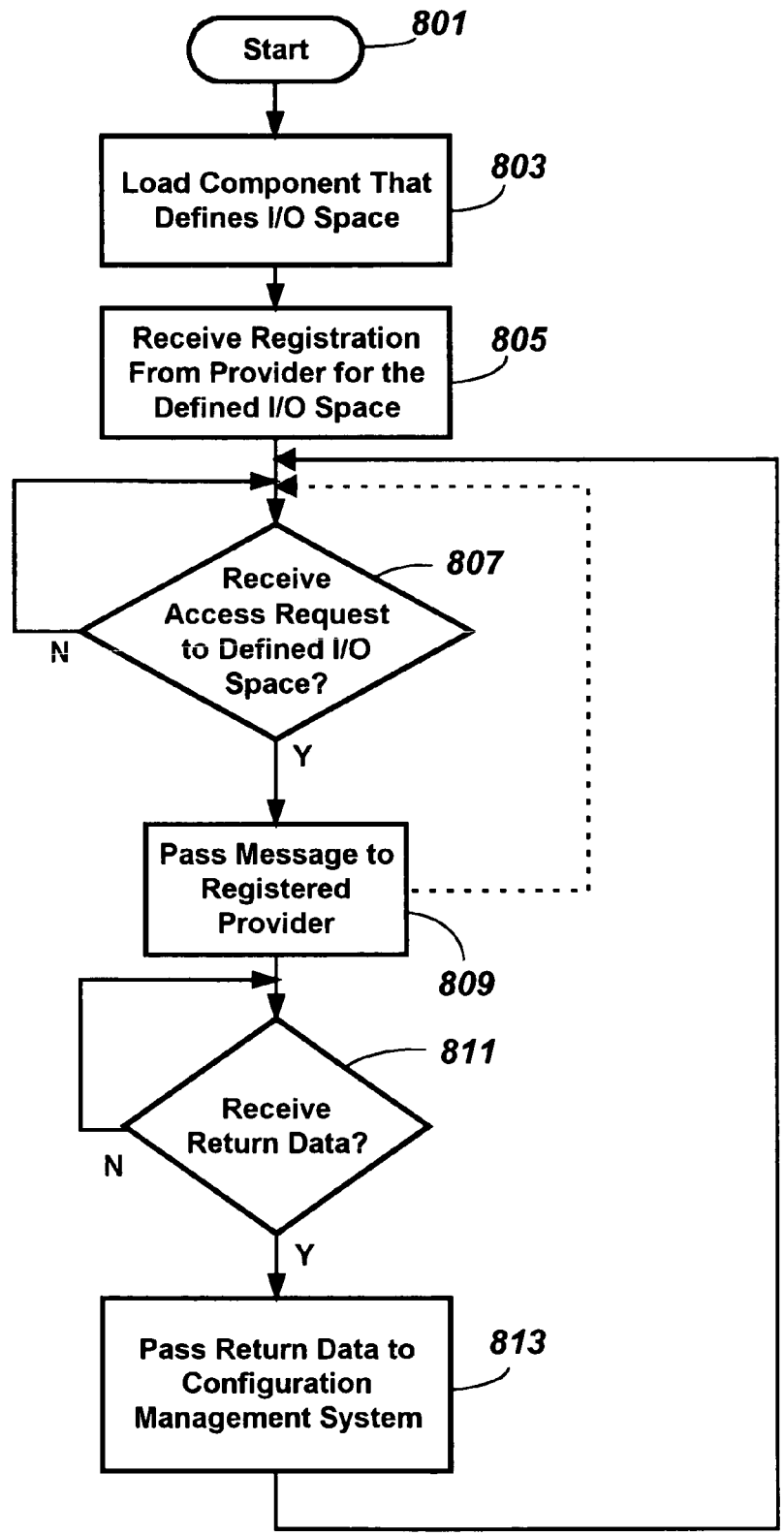
FIG. 8 is a logical flow diagram generally representing a process performed by one component of a configuration management system configured in accordance with the invention to simulate I/O access to a hardware device.

FIGS. 7 and 8 are logical flow diagrams summarizing the processes performed by components of the above-described illustrative configuration management system that implements the present invention. FIG. 7 is a logical flow diagram of a process 700 performed by the ACPI driver 202 of the ACPI system 202 to simulate a hardware-generated ACPI event, such as a system control interrupt. The process 700 begins at block 701, where the ACPI driver 202 loads into memory a component that defines a method for issuing a simulated event notification. In the above example, the ACPI driver 202 loads a definition block into the ACPI name space 300 that defines a control method, which, when later executed by the simulator driver 409, will issue a notification corresponding to the simulated event to the ACPI system 200.

At decision block 703, the ACPI driver 202 awaits an instruction to execute the method defined at block 701. The process 700 remains at decision block 703 until some component of the ACPI system 200, such as the simulator driver 409, requests that the method be executed, when the process 700 continues to block 705. Note that the ACPI driver 202 may be event-driven, and the process 700 is shown in a loop for simplicity of illustration only.

At block 705, the ACPI driver 202 executes the method defined at block 701, which causes the simulated event notification to be issued. For example, in the system described in FIGS. 4–6, the \_Q13 control method 513, when executed, generates an event notification that simulates a hardware thermal sensor issuing an interrupt caused by a change in temperature. In this way, by providing a control method that issues a simulated event upon execution, the simulator driver 409 can arbitrarily cause the simulated event to occur at any time. The process returns to block 703 to await a further instruction and repeat the process 700 until otherwise terminated.

FIG. 8 is a logical flow diagram of a process 800 performed by the ACPI driver 202 of the ACPI system 202 to simulate I/O access to a hardware device. The process begins at block 803, where the ACPI driver 202 loads into memory a component that defines an I/O space for passing information to and from a simulated hardware device. For example, in the system illustrated in FIGS. 4–6, an operation region is defined as a data object to be used when reading from or writing to the simulated device created by the namespace object MEC0 503.

At block 805, the ACPI driver 202 receives a registration from a provider for the I/O space defined at block 803. As discussed above, a user-defined I/O space needs a provider registered to handle messages issued to that space. In the above example, the simulator driver 409 registers with the ACPI driver 202 as a provider for the operation region defined for use with the namespace object MEC0 503.

At decision block 807, the ACPI driver 202 ultimately receives a message or request to access the I/O space defined at block 803. For example, an event within the ACPI system 200 (i.e., the simulated hardware interrupt generated by the process 700 illustrated in FIG. 7) may cause the ACPI driver 202 to request information from the simulated hardware device. Likewise, the ACPI driver 202 may desire to write information to the simulated hardware device. In those cases, the ACPI driver 202 passes the message or request to the provider registered to handle the I/O space at block 809.

At decision block 811, the ACPI driver 202 awaits the return of any data that may have been requested by the message to the provider. It should be noted that return data may not be necessary, such as in the case of a write of data to the simulated hardware device. If return data is not appropriate, the process 800 may return to await another access request as illustrated by the dashed line from block 809 to the decision block 807. For the cases where return data is appropriate, the ACPI driver 202 awaits, at decision block 811, for the return data. When the ACPI driver 202 receives the return data, the process 800 proceeds to block 813. As will be appreciated, the process 800 may terminate naturally through timeout mechanisms (not shown) while waiting for data to return.

At block 813, the ACPI driver 202 passes the data received at decision block 811 to the configuration management system. For example, in the example illustrated by FIGS. 4–6, the simulator driver 409 was configured to return a value for the temperature of the simulated thermal zone. Once the ACPI driver 202 passes the return data to the configuration management system, the process 800 returns to block 807 to await further requests until otherwise terminated, such as by the expiration of a timer or interrupted by another process.

While the invention has been primarily described in a debugging or prototyping environment, those skilled in the art will appreciate that the invention has broad applicability in a configuration and power management system. In one example, the invention may be implemented in an environment for simulating compliance with the configuration and power management system for hardware which is in fact non-compliant. For instance, a driver may be configured in accordance with the invention to generate events on behalf of non-compliant hardware in situations which would ordinarily result in the generation of the event by compliant hardware. Moreover, the driver may be configured in accordance with the invention to access data within hardware or issue instructions to hardware through I/O mechanisms that are not in accordance with the traditional configuration and power management system.

As can be seen from the foregoing detailed description, the invention provides a system and method for simulating the actions and/or the existence of compliant hardware in a configuration management system. While the invention is susceptible to various modifications and alternative constructions, certain illustrated embodiments thereof are shown in the drawings and have been described above in detail. It should be understood that the invention is not limited to the specific forms disclosed, but rather, the invention covers all modifications, alternatives, and equivalents falling within the spirit and scope of the claims.

What is claimed is:

1. A computer-readable medium having computer-executable instructions, comprising:
   loading a component in a configuration management system, wherein the component interfaces with the configuration management system to generate simulated events, the component including a control method configured to issue a simulated event notification corresponding to a hardware device response that is simulated by the component;
   receiving an instruction to execute the control method; and
   issuing the simulated event notification.

2. The computer-readable medium of claim 1, wherein loading the component in the configuration management system comprises loading the component in an information store of the configuration management component, the information store including other objects configured to provide access to elements of the configuration management system.

3. The computer-readable medium of claim 2, wherein the information store comprises a namespace.

4. The computer-readable medium of claim 1, wherein the simulated event notification is related to another control method loaded in the configuration management system, the other control method being executed in response to a message issued by the hardware device.

5. The computer-readable medium of claim 4, wherein the message issued by the hardware device is an interrupt message.

6. The computer-readable medium of claim 5, wherein the interrupt message is a System Control Interrupt message issued by the hardware device to the configuration management system.

7. The computer-readable medium of claim 4, wherein the other control method is a General Purpose Event control method.

8. The computer-readable medium of claim 1, wherein issuing the simulated event notification comprises issuing a notify message to the configuration management system, the notify message being associated with the occurrence of an event related to the hardware device.

9. The computer-readable medium of claim 8, wherein the event related to the hardware device comprises the issuance of an interrupt.

10. The computer-readable medium of claim 9, wherein the interrupt is a System Control Interrupt.

11. A computer-readable medium having computer-executable instructions, comprising:
    loading a component in a configuration management system, wherein the component interfaces with the configuration management system to generate simulated events, the component defining an I/O space for providing access to a simulated hardware device response;
    registering a provider to handle instructions issued to the defined I/O space;
    receiving an instruction from a requesting component of the configuration management system to access the simulated hardware device response through the defined I/O space; and
    passing the instruction to the provider registered to handle the instruction.

12. The computer-readable medium of claim 11, further comprising:
    receiving data returned from the provider; and
    passing the returned data to the requesting component.

13. The computer-readable medium of claim 12, wherein the data returned from the provider comprises information associated with the simulated hardware device response.

14. The computer-readable medium of claim 13, wherein the information associated with the simulated hardware device response comprises data generated by a tester component and provided to the provider by the tester component.

15. The computer-readable medium of claim 11, wherein the defined I/O space comprises an operation region of the configuration management system.

16. The computer-readable medium of claim 11, wherein the component is loaded in an information store associated with the configuration management system.

17. The computer-readable medium of claim 16, wherein the information store comprises a namespace.

18. A computer-readable medium having computer-executable components, comprising:
    a definition block including a data object that defines an I/O space for accessing a simulated hardware device response;
    a first driver configured to populate an information store in a configuration management system with information from the definition block including the data object; and
    a second driver configured to register with the configuration management system to handle an instruction directed to the data object, the second driver being further configured to respond to the first driver with simulated data associated with the simulated hardware device response to enable simulated hardware events.

19. The computer-readable medium of claim 18, wherein:
    the definition block further comprises a control method configured to issue a simulated event notification upon being executed;
    the first driver is further configured to populate the information store with the control method; and
    the second driver is further configured to issue an instruction to the first driver to cause the control method to be executed.

20. The computer-readable medium of claim 19, wherein the configuration management system is configured to respond to the issuance of the simulated event notification by issuing the instruction directed to the data object.

21. The computer-readable medium of claim 20, further comprising a tester application configured to interface with the second driver and to cause the second driver to issue the instruction to the first driver.

22. The computer-readable medium of claim 18, further comprising:
   a tester application configured to interface with the second driver and to provide the simulated data to the second driver for response to the first driver.

23. The computer-readable medium of claim 19, further comprising:
   a tester application configured to interface with the second driver and to cause the second driver to issue the instruction to the first driver.

24. A computer-readable medium having computer-executable components, comprising:
   a definition block including a control method configured to generate an event notification when executed, the event notification being a simulation of an event generated by a hardware device response;
   a first driver configured to populate an information store in a configuration management system with information from the definition block including the control method, the first driver being further configured to execute the control method in response to an instruction; and
   a second driver configured to issue to the first driver the instruction to execute the control method,
   wherein the control method, the first driver, and the second driver interface with the configuration management system to enable the simulated hardware event.

25. The computer-readable medium of claim 24, wherein the information store in the configuration management system comprises a namespace.

26. The computer-readable medium of claim 24, wherein the event generated by the hardware device comprises a General Purpose Event.

27. The computer-readable medium of claim 24, wherein the event notification further comprises a notify message directed to the configuration management system, the notify message being associated with the occurrence of an event related to the hardware device.

28. The computer-readable medium of claim 27, wherein the event related to the hardware device comprises the issuance of an interrupt.

29. The computer-readable medium of claim 28, wherein the interrupt is a System Control Interrupt.

30. A computer system having a hardware device, comprising:
   a controller configured to execute a control method, the control method being configured to perform a first action associated with a simulated hardware device response;
   a driver configured to cause the controller to execute the control method; and
   a provider configured to handle a request to perform a second action, the second action being associated with the simulated hardware device response, the provider interfacing with the controller to provide simulated hardware events,
   wherein the driver causes the controller to execute the control method, and, in response, the controller performs the first action including issuing the request to the provider to perform the second action.

31. The computer system of claim 30, wherein the first action comprises issuing a notification to a component of an operating system, the notification being related to the simulated hardware device.

32. The computer system of claim 31, wherein the component of the operating system is a kernel component.

33. The computer system of claim 31, wherein the notification related to the simulated hardware device causes the component of the operating system to perform an access of the simulated hardware device.

34. The computer system of claim 33, wherein the access of the simulated hardware device comprises a read of information from the simulated hardware device.

35. The computer system of claim 33, wherein the access of the simulated hardware device comprises a write of information to the simulated hardware device.

36. The computer system of claim 30, wherein the provider configured to handle the request is registered with the controller as a handler of an access region associated with the controller, and wherein the access region is configured to provide access to the simulated hardware device.

37. The computer system of claim 36, wherein the access region is an operation region.

38. The computer system of claim 36, wherein the request to perform the second action comprises a read of information from the simulated hardware device.

39. The computer system of claim 36, wherein the request to perform the second action comprises a write of information to the simulated hardware device.

40. The computer system of claim 30, wherein the driver is further configured to cause the controller to execute the control method in response to a triggering event.

41. The computer system of claim 40, wherein the triggering event includes a message from an application program instructing the driver to cause the controller to execute the control method.

42. The computer system of claim 40, wherein the triggering event includes a timeout event.

43. The computer system of claim 40, wherein the triggering event includes a hardware interrupt.

44. A computer-readable medium having computer-executable instructions, comprising:
   loading a component in a configuration management system, wherein the component interfaces with the configuration management system to generate simulated events, the component including a control method configured to issue a simulated event notification corresponding to a simulated hardware device response;
   receiving an instruction to execute the control method, the instruction performing an access of a simulated hardware device, the access comprising a write of information to the simulated hardware device; and
   issuing the simulated event notification.

45. The computer-readable medium of claim 44, wherein the access further comprises a read of information from the simulated hardware device.

46. The computer-readable medium of claim 44, wherein the simulated event notification is an asynchronous event.

47. The computer-readable medium of claim 44, wherein the simulated event notification is related to another control method loaded in the configuration management system, the other control method being executed in response to the simulated hardware device response associated with the configuration management system.

48. The computer-readable medium of claim 44, wherein issuing the simulated event notification comprises issuing a notify message to the configuration management system, the notify message being associated with the occurrence of an event related to the simulated hardware device response.

* * * * *